United States Patent [19]

Bich

[11] 4,048,635
[45] Sept. 13, 1977

[54] SEISMIC PLAYBACK/MONITOR SYSTEM

[75] Inventor: John R. Bich, Houston, Tex.

[73] Assignee: Texaco Inc., New York, N.Y.

[21] Appl. No.: 597,050

[22] Filed: Sept. 15, 1975

[51] Int. Cl.$^2$ ............................................. H03K 13/03
[52] U.S. Cl. .............................. 340/347 DA; 235/154; 340/15.5 GC
[58] Field of Search ................ 340/347 DA, 347 AD, 340/15.5 R, 15.5 SS, 15.5 A, 15.5 DS, 15.5 DP, 15.5 GC; 235/154; 150.53; 328/142, 143, 145

[56] References Cited

U.S. PATENT DOCUMENTS

| 3,673,398 | 6/1972 | Loofbourrow | 235/150.53 |
|---|---|---|---|
| 3,684,968 | 8/1972 | Carroll | 340/347 AD |
| 3,685,046 | 8/1972 | Howlett | 340/347 DA |
| 3,863,058 | 1/1975 | Savit | 340/15.5 DP |
| 3,872,465 | 3/1975 | Loofbourrow | 235/154 |

Primary Examiner—Malcolm A. Morrison
Assistant Examiner—Errol A. Krass
Attorney, Agent, or Firm—Thomas H. Whaley; Carl G. Ries; Ronald G. Gillespie

[57] ABSTRACT

Hereinafter disclosed is methodology and apparatus for converting wide dynamic amplitude range digital data recorded in floating point digital word form, comprising a binary coded mantissa and a binary coded exponent, to an analog signal or visible display such as an oscillogram or "wiggle trace" of selectively compressed dynamic amplitude range. The digital word occupying a number of binary digit or bit positions is in algebraic form $\pm AG^{-E}$; wherein A represents the mantissa or argument; G represents the radix or base of the number system used; and, E represents an exponent. Since the radxi G is constant the only binary digits or bits that need to be recorded are those bits representing the mantissa A and the exponent E. In reconverting the aforementioned digital data to analog form data for making an oscillogram, wiggle trace or other visible display the invention involves the selective compression of the dynamic amplitude range of analog signal and at the same time avoiding the introduction of serious distortions.

6 Claims, 1 Drawing Figure

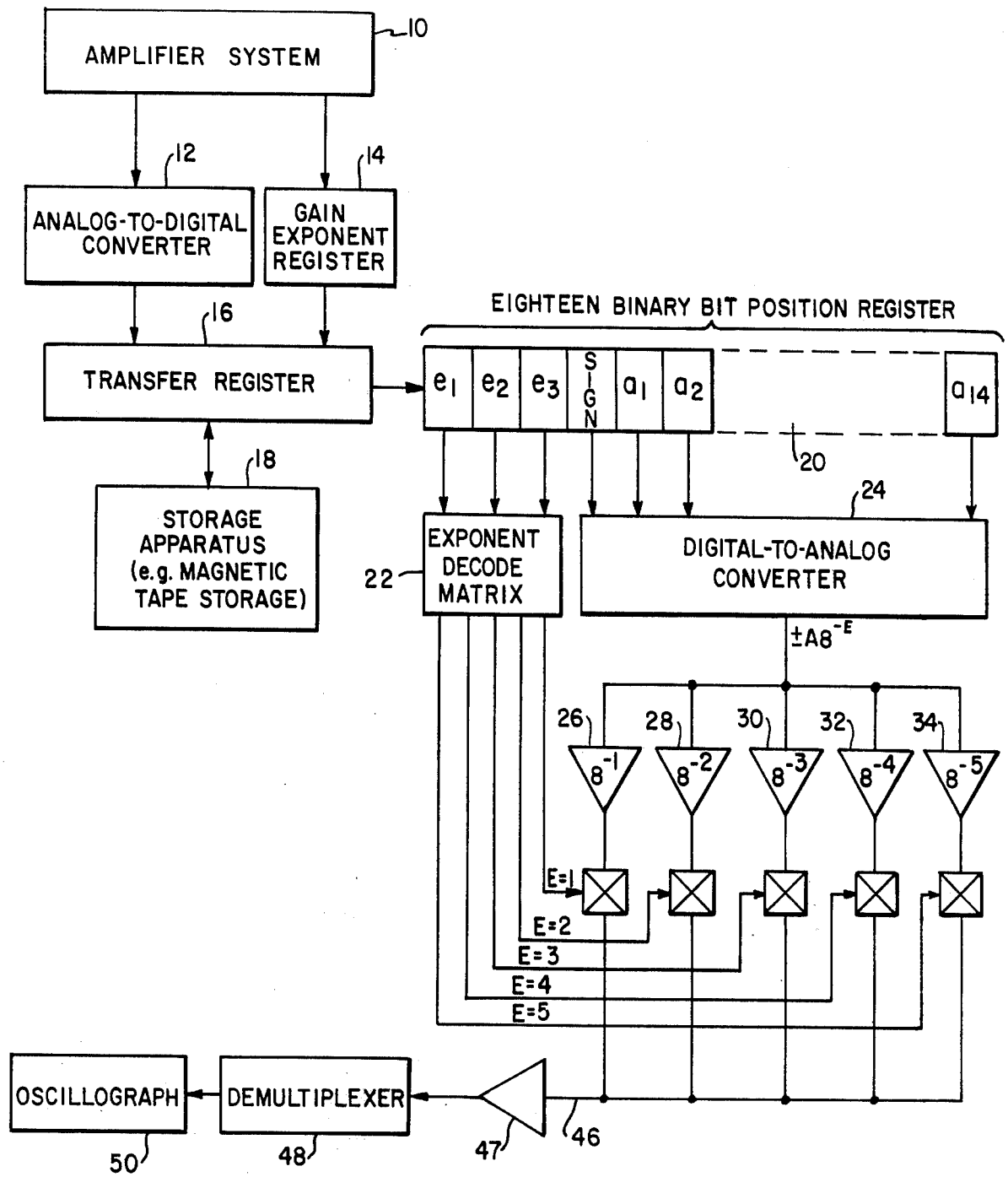

SEISMIC PLAYBACK/MONITOR SYSTEM

BACKGROUND OF THE INVENTION

1. Field of the Invention

This invention pertains, in general, to making analog form playbacks from digitally recorded data (e.g., seismic data) which has been digitized from wide dynamic amplitude range analog for signals.

2. Description of the Prior Art

In seismic exploration work each acoustically driven geophone generates wide dynamic amplitude range signals in analog form. When such signals are processed through a digital seismic recording system there is produced a high fidelity record in digital form covering the dynamic range of amplitudes of the seismic signals. The reason that the digital form record is referred to herein as a high fidelity record is because the signal amplitudes are recorded accurately throughout their wide dynamic range; e.g., many binary digit or bit positions are used to record the highest signal amplitude as well as the lowest where the range (i.e., the ratio of the highest signal amplitude to the lowest signal amplitude) may be of the order of $10^6$.

The present invention provides a method and apparatus for making analog form oscillograms or wiggle traces from the recorded digital data. The oscillograms are of relatively lower fidelity than the aforementioned digitally recorded data. Although the oscillograms are of relatively lower fidelity serious distortions are nevertheless not introduced in reconverting the digital data to analog data for the purpose of making compressed amplitude range oscillograms. The recordation in digital form of wide dynamic amplitude range analog signals initially generated by geophones is disclosed in, among other, the following: U.S. Pat. No. 3,241,100 issued Mar. 15, 1966 in behalf of R. J. Loofbourrow and entitled "Digital Seismic Recording System"; U.S. Pat. No. 3,264,574 issued Aug. 2, 1966 in behalf of R. J. Loofbourrow and entitled "Amplifier System"; U.S. Pat. No. 3,603,972 issued Sept. 7, 1971 to James R. Vanderford and entitled "Amplifier System"; U.S. Pat. No. 3,685,046 issued Aug. 15, 1972 to Donald L. Howlett and entitled "Seismic Playback/Monitor System" and U.S. Pat. No. 3,872,465 issued Mar. 18, 1975 to Robert J. Loofbourrow and entitled "Seismic Playback/Monitor System".

As is disclosed in the patents hereinbefore identified the problem solved is the problem of accurately recording seismic data which in analog form has a dynamic range of amplitude which is extremely wide. For example, a typical analog signal level for a reflection seismic record runs from several volts of amplitude at its maximum at the early shock portion of the record to less than a single microvolt at the end of the seismic record when low amplitude seismic disturbances are detected. In general the aforementioned patents disclose systems for converting the wide dynamic amplitude range analog signal to digital form. When converted to digital form occupying a relatively large number of binary digit or bit positions the full dynamic amplitude range of the analog signals initially generated by a geophone is preserved in recorded form; e.g., on magnetic tape. Advantageously the magnetically recorded digital data may afterward be delivered to a computer for further processing. Some methods and some purposes for which such digital data is subsequently processed in a computer are disclosed in an article "Tools for Tomorrow's Geophysics" by Milton D. Vobrin and Stanley H. Ward, published in the Journal "Geophysical Prospecting" Vol. X at pp. 433–452 (1962).

In the aforementioned Vanderford and Howlett patents there is disclosed a system wherein portions of an analog signal are converted to digital word wherein each digital word occupies a number of binary digit or bit positions. Also each such digital word is recorded in floating point form. The floating point form of notation allows greater flexibility of operation and easier handling of numbers which differ greatly in magnitude from each other. See for example the textbook "Digital Computer Primer" by E. M. McCormick, 1959, published by McGraw-Hill Book Company, Inc. beginning at page 152. In the system disclosed in the Vanderford and Howlett patents hereinbefore identified, a floating point digital word or number in the form of a mantissa or argument and an exponent is recorded on a suitable storage medium such as magnetic tape. The floating point digital word represents the instantaneous absolute seismic voltage amplitude as it is introduced to a floating point amplifier system. The dynamic range of the floating point word may be in excess of 200 db if necessary to cover the dynamic range of input signals (equivalent to a 36 binary digit or bit digital number or word).

As a specific example the floating point word or number as set forth in conventional algebraic form is as follows:

$$V_{in} = \pm AG^{-E}$$

wherein $V_{in}$ represents the absolute magnitude or amplitude of the floating point word; $A$ represents the mantissa or argument portion of the word; $G$ represents the radix or base of the number system used ($G = 10$ in the decimal system or $G = 8$ in the octal system); and $E$ represents the exponent.

As is suggested in the aforementioned patents the floating point digital word is in the form:

$$Q = \pm A8^{-E}$$

wherein $Q$ represents the absolute magnitude of the amplitude of the input signal delivered to an arrangement of amplifiers each of which has a gain of 8 and hence, the base $G$ in equation 1 becomes 8 in equation 2; the mantissa $A$ represents the output amplitude of a particular amplifier in the aforesaid arrangement; and $E$, the exponent represents the number of amplifier stages of gain of 8 through which the aforesaid input signal has been processed.

In order to record the floating point digital word of equation 2 in a binary register with for example, 144 db of dynamic range and with 14 bit accuracy 18 bit position would be required; wherein the mantissa $A$ is represented in binary form and where the mantissa $A$ is represented in binary form and where the exponent $E$ is also represented in binary form. Of the 18 bits required, one bit represents the sign allowing for bi-polar input-output capabilities; 14 bits represent the mantissa $A$; and three bits represent the exponent $E$.

Although there are many advantages to recording seismic signals in digital form there still remains the need to make available to a seismic prospector a visible display or recording of the seismic data or portions of it. Conventionally the visible record is an oscillogram or wiggle trace as it is often called by seismic prospectors. Often it is desirable for a seismic prospector and a seismic field crew in a remote location from a main data processing center to take a quick look at a portion of the seismic data from time to time for example, a seismic prospector may wish to make some interpretations with respect to the oscillogram in order to coordinate such data with geological data.

The invention hereinafter disclosed and illustrated in the accompanying drawings, is particularly concerned with converting the recorded seismic data to the familiar wiggle trace form on recording paper. The recording paper allows about 40 db dynamic amplitude range while the digital floating point word may have a dynamic range of 156 db or more. Hence, in converting from digital form to a practical analog form, selective compression of the various amplitudes must occur. In such a conversion distortion is necessarily introduced. However, in accordance with the methodology and apparatus embodying the subject invention such distortion is minimized and as a result there is provided analog form data in the form of oscillogram or wiggle traces which provide useful information to seismic prospectors among others.

SUMMARY OF THE INVENTION

Apparatus recreates an analog signal, which had been converted to digital floating point word form the word being represented by the general algebraic form $Q_2 = \pm AB^{31\ E}$ wherein $Q_2$ represents the amplitude of the analog signal, $A$ represents the mantissa, $B$ indicates the radix of the number system used and $E$ represents the exponent. The word is represented by a first plurality of binary bits corresponding to $\pm A$ and a second plurality of binary bits corresponding to $E$. The apparatus includes digital-to-analog converter which converts the first plurality of bits to an analog signal coresponding to $\pm A$. A second converter converts the second plurality of bits, corresponding to $E$, to control signal. A plurality of attenuators, coresponding in number to the number of control signals, receive the $\pm A$ analog signal from the first converter. Each attenuator attenuates the $\pm A$ analog by a different amount and provides a corresponding output signal. A plurality of switches are connected to the attenuators and controlled by the control signal so that only one attenuator output is provided as a common output signal, and amplifier means for amplifying the commn output signal to provide the recreated analog signal.

The object and advantages of the invention will appear more fully hereinafter from a consideration of the detailed description which follows, taken together with the accompanying drawings wherein one embodiment of the invention is illustrated by way of example. It is to be expressly understood however that the drawings are for illustrative purposes only and are not to be construed as defining the limits of the invention.

DESCRIPTION OF THE DRAWING

The drawing is a block diagram of a system which includes apparatus, constructed in accordance with the present invention, for receiving an analog signal from a digital word representing the general algebraic form $Q = \pm AB^{-E}$.

DESCRIPTION OF THE INVENTION

As shown the reference number 10 identifies an amplifier system such as the system disclosed in the Vanderford patent hereinbefore identified. As is indicated, output signal from the amplifier system 10 are delivered to an analog-to-digital converter 12 and to a gain exponent register 14. The analog-to-digital converter 12 digitizes selected signals received from the amplifier system 10. Also, the gain exponent register 14 temporarily stores signals received from the amplifier system 10.

From the analog-to-digital converter 12 and from the given exponent register 14 signals representing binary bits "1" or "0" are delivered to a transfer register 16 for temporary storage therein. The transfer register 16, as illustrated, is capable of storing 18 binary bits. One bit position is used to represent the sign or polarity of the analog signal. Fourteen bit positions are used to represent the maintissa of the floating point word and three bit positions are used to represent the exponent thereof. As stated hereinbefore with reference to the discussion of equation 2 since the gain of each stage in the floating point amplifier system 10 is eight the only binary bits that need to be processed and recorded are those representing the mantissa $A$ and the exponent $E$. In the system disclosed in the Vanderford patent it is contemplated that the binary bits stored in the transfer register 16 will ultimately be more permanently stored in storage apparatus 18 such as, for example, on magnetic tape. As is indicated by the opposing arrowheads on the line connecting transfer register 16 and storage apparatus 18, storage apparatus 18 can redeliver its stored binary bits back to the transfer register 16 for temporary storage for ultimate processing in the manner hereinafter described.

Also provided is an additional register 20 for, among other things, temporary storage of the binary bits which are received from transfer register 16. The additional register 20 is labeled as "Eighteen binary bit position register". As is indicated the register 20 has 18 positions or storage locations. One of these positions houses the sign or polarity bit. Fourteen of the positions are for storing the bit representative of the mantissa $A$ in equation 2. Three of these positions are for storing bits representing the exponent $E$ equation 2. In register 20 the position for storing the sign bit is labeled SIGN. The positions for storing the bits representing the mantissa are identified as $a_1, a_2 \ldots a_{14}$. The positions for storing the bits representing the exponent are identified as $e_1, e_2$ and $e_3$.

As is indicated signals in the form of binary bits from the positions $e_1$, $e_2$ and $e_3$ in register 20 are delivered to an exponent decode matrix 22. Also, the signals in the form of binary bits from the SIGN bit position and from the mantissa bit position $a_1$ through $a_{14}$ in the register 20 are delivered to a digital-to-analog converter 24. The exponent decode matrix 22 functions to convert the binary form signals, or bits, received from the bit positions $e_1$, $e_2$ and $e_3$ of register 20 to a particular voltage level. The particular voltage level signals are indicated at the output of the exponent decode matrix 22 as $E = 1$, 2, 3, 4 or 5. For example, if the positions $e_1$, $e_2$ and $e_3$ in register 20 contained storage signals representing the binary bits 101, respectively, which is the equivalent of the decimal number 5, then only the voltage signal $E = 5$ would appear at the output of the exponent decode matrix 22.

From the converter 24 an analog signal, corresponding to $\pm A$ in equation 2, is fed to the five attenuators 26, 28, 30, 32 and 34. These attenuators, as indicated, function to attenuate the analog signal by factors $8^{-1}$, $8^{-2}$, $8^{-3}$, $8^{-4}$ and $8^{-5}$, respectively. Simultaneously with the delivery of the analog signal to said attenuators the appropriate exponent signal $E = 1, 2, 3, 4$ or 5 turns on an appropriate one of the switches 36 (if $E = 1$), 38 (if $E = 2$), (if $E = 3$), 42 (if $E = 4$), or 44 (if $E = 5$).

Thus, the analog signal is delivered via line 46 to an amplifier 47, demultiplexer means 48 and oscillograph 50. Any desired gain function can be applied to the signal by amplifier 47 before delivery to demultiplexer means 40.

Demultiplexer means 48 includes a plurality of hold and filter stages demultiplexing to recreate and provide the smoothed analog signals from sampled digital data.

Although specific ways and means for practicing the invention have described hereinbefore and illustrated in the accompanying drawing, it is nevertheless to be understood that this has been done for purposes of illustration only and that the scope of the invention is not limited thereby but is to be determined from the appended claims.

What is claimed is:

1. In a system wherein a wide dynamic amplitude range analog signal is digitized in floating point word form, said word being represented in digital signal form by the general algebraic form $Q = \pm AB^{-E}$ wherein $Q$ represents the amplitude of the analog signal, $A$ represents the mantissa, $B$ indicates the radix of the number system used, $E$ represents the exponent, and wherein said word is represented by a first plurality of binary bits representing $\pm A$ and a second plurality of binary bits representing E, a system for recreating an analog signal from the floating point words comprising: first means for converting said bits representing $A$ to an analog signal; second means for converting said bits representing $E$ to a plurality of control signals, each control signal representing a particular value of $E$; a plurality of attenuator means, each attenuator means being coupled to said first converting means for attenuating said analog signal from the first converting means by a different amount to provide an output signal; a plurality of switch means, each switch means being connected to a different attenuator means and receiving a different control signal and controlled by the second converting means to pass or block to an output signal from the attenuator; and amplifier means coupled to all said switch means for providing the recreated analog signal in accordance with an output signal passed by one of the switch means.

2. A system as described in claim 1 in which $B$ corresponds to 8.

3. A system as described in claim 2 further comprising an oscillograph connected to the amplifier for recording the recreated analog signal.

4. A system as described in claim 2 in which each attenuator attenuates the analog signal from the first converting means by a value of 8 raised to a different negative exponent.

5. A system as described in claim 4 in which a plurality of wide dynamic amplitude range analog signals are multiplexed and digitized in floating point word form and further comprising means connected to the amplifier means for demultiplexing the signal provided by the amplifier means, to provide a recreated analog signal for every signal which had been digitized.

6. A system as described in claim 5 further comprising oscillograph means connected to the demultiplexing means for recording the recreated signals.

* * * * *